United States Patent [19]

Riggle et al.

[11] 4,413,339

[45] Nov. 1, 1983

[54] MULTIPLE ERROR DETECTING AND CORRECTING SYSTEM EMPLOYING REED-SOLOMON CODES

[75] Inventors: Charles M. Riggle, Acton; Lih-Jyh Weng, Lexington; Norman A. Field, Maynard, all of Mass.

[73] Assignee: Digital Equipment Corporation, Maynard, Mass.

[21] Appl. No.: 277,060

[22] Filed: Jun. 24, 1981

[51] Int. Cl.³ .............................................. G06F 11/12
[52] U.S. Cl. .................................................... 371/38
[58] Field of Search .................... 371/37–41, 371/45, 54; 364/200 MS File, 900 MS File

[56] References Cited

U.S. PATENT DOCUMENTS

| | | | |
|---|---|---|---|
| 3,533,067 | 10/1970 | Zierler et al. | 340/146.1 |
| 3,648,236 | 3/1972 | Burton | 340/146.1 |
| 3,668,632 | 6/1972 | Oldham | 340/146.1 |
| 3,714,629 | 1/1973 | Hong et al. | 340/146.1 |
| 3,801,955 | 4/1974 | Howell | 371/40 |
| 3,859,630 | 1/1975 | Bennett | 340/146.1 |
| 3,868,632 | 2/1975 | Hong et al. | 371/38 |
| 3,913,068 | 10/1975 | Patel | 340/146.1 |
| 3,983,536 | 9/1976 | Telfer | 340/146.1 |
| 4,030,067 | 6/1977 | Howell et al. | 340/146.1 |
| 4,059,825 | 11/1977 | Greene | 340/146.1 |
| 4,089,063 | 5/1978 | Takezono et al. | 365/200 |
| 4,099,160 | 7/1978 | Flagg | 340/146.1 |
| 4,117,458 | 9/1978 | Burghard et al. | 340/146.1 |
| 4,142,174 | 2/1979 | Chen et al. | 340/146.1 |
| 4,162,480 | 7/1979 | Berlekamp | 364/200 |
| 4,320,510 | 3/1982 | Kojima | 371/38 |
| 4,360,916 | 11/1982 | Kustedjo et al. | 371/38 |

OTHER PUBLICATIONS

Lin, Shu; An Introduction to Error-Correcting Codes, Prentice Hall; Chapter 6, pp. 112–135.

Peterson, W. Wesley and Weldon, E. J. Jr.; Error Correcting Codes, pp. 269–304.
Berlekamp, Elwyn R.; The Technology of Error-Correcting Codes; The Proceedings of the IEEE, vol. 68, No. 5, May 1980, pp. 564–593.

Primary Examiner—Jerry Smith
Assistant Examiner—Gary V. Harkcom
Attorney, Agent, or Firm—Cesari and McKenna

[57] ABSTRACT

An error detecting and correcting system implementing the Reed-Solomon (1023, 1006) code having code words whose symbols are elements in the Galois field $GF(2^{10})$ generated by either the primitive polynomial $x^{10}+x^3+1$ or $x^{10}+x^7+1$. An original data word is encoded to produce a code word w(x) including a first set of checksum symbols appended thereto. Upon retrieval, the data symbols of the receive code word y(x) are encoded by the same encoder that encodes the original data word to produce a second set of checksum symbols. Both sets of checksum symbols are modulo-two summed to produce a residue R(x) from which error syndromes $S_i$ can be computed and thus enable rapid correction of errors in the received code word y(x). The system also monitors the number of non-zero symbols in the residue R(x) in order to avoid unnecessary computation of error syndromes $S_i$ and other decoding routines, such as when the received code word y(x) is otherwise uncorrectable or when the error exists only in the received checksum symbols, rather than in the data symbols. The distance between code words being (2T+2), the error correction routine is bypassed when the number of non-zero symbols in R(x) is less than or equal to T, which indicates that errors only reside in the checksum symbols. When the number of non-zero symbols equals (T+1), the error is uncorrectable. For determining whether a single error exists so that correction can quickly be made, the system also tests whether $S_{i+1}/S_i$ is constant for all error syndromes $S_i$.

19 Claims, 9 Drawing Figures

Fig. 4  REED-SOLOMON ENCODER 24

FEEDBACK DIVIDER COEFFICIENTS FOR g(x)
PRIMITIVE POLYNOMIAL: $x^{10}+x^3+1$

| | $\alpha^{226}$ | $\alpha^{274}$ | $\alpha^{928}$ | $\alpha^{509}$ | $\alpha^{406}$ | $\alpha^{423}$ | $\alpha^{624}$ | $\alpha^{10}$ |
|---|---|---|---|---|---|---|---|---|
| BIT# 0 | 0,1,3,4,5 | 0,1,3,8,9 | 1,2,4,5,6,9 | 1,4,7,9 | 2,3,4,6,9 | 0,1,3,5,8 | 1,2,4,8,9 | 0,7 |
| BIT# 1 | 1,2,4,5,6 | 0,1,2,4,9 | 2,3,5,6,7 | 0,2,5,8 | 3,4,5,7 | 1,2,4,6,9 | 2,3,5,9 | 1,8 |
| BIT# 2 | 0,2,3,5,6,7 | 1,2,3,5 | 0,3,4,6,7,8 | 0,1,3,6,9 | 4,5,6,8 | 2,3,5,7 | 3,4,6 | 2,9 |
| BIT# 3 | 5,6,7,8 | 1,2,4,6,8,9 | 2,6,7,8 | 0,2,9 | 2,3,4,5,7 | 1,4,5,6 | 1,2,5,7,8,9 | 0,3,7 |
| BIT# 4 | 6,7,8,9 | 2,3,5,7,9 | 0,3,7,8,9 | 1,3 | 0,3,4,5,6,8 | 2,5,6,7 | 2,3,6,8,9 | 1,4,8 |
| BIT# 5 | 0,7,8,9 | 3,4,6,8 | 0,1,4,8,9 | 2,4 | 1,4,5,6,7,9 | 0,3,6,7,8 | 3,4,7,9 | 2,5,9 |
| BIT# 6 | 0,1,8,9 | 4,5,7,9 | 0,1,2,5,9 | 0,3,5 | 0,2,5,6,7,8 | 1,4,7,8,9 | 0,4,5,8 | 3,6 |
| BIT# 7 | 0,1,2,9 | 0,5,6,8 | 1,2,3,6 | 1,4,6 | 0,1,3,6,7,8,9 | 0,2,5,8,9 | 1,5,6,9 | 4,7 |
| BIT# 8 | 1,2,3 | 1,6,7,9 | 0,2,3,4,7 | 2,5,7 | 0,1,2,4,7,8,9 | 1,3,6,9 | 0,2,6,7 | 5,8 |
| BIT# 9 | 0,2,3,4 | 0,2,7,8 | 0,1,3,4,5,8 | 0,3,6,8 | 1,2,3,5,8,9 | 0,2,4,7 | 0,1,3,7,8 | 6,9 |

Fig. 8

FEEDBACK DIVIDER COEFFICIENTS OF g(x) OVER $GF(2^{10})$ GENERATED BY $x^{10}+x^7+1$

| | $\alpha^{797}$ | $\alpha^{749}$ | $\alpha^{95}$ | $\alpha^{414}$ | $\alpha^{617}$ | $\alpha^{600}$ | $\alpha^{399}$ | $\alpha^{1013}$ |
|---|---|---|---|---|---|---|---|---|
| BIT# 0 | 5,6,7,9 | 1,2,7,9 | 1,4,5,6,8,9 | 1,3,6,9 | 0,1,4,6,7,8 | 2,5,7,9 | 1,2,6,8,9 | 0,3 |
| BIT# 1 | 6,7,8 | 0,2,3,8 | 2,5,6,7,9 | 2,4,7 | 0,1,2,5,7,8,9 | 0,3,6,8 | 2,3,7,9 | 1,4 |
| BIT# 2 | 0,7,8,9 | 1,3,4,9 | 3,6,7,8 | 3,5,8 | 0,1,2,3,6,8,9 | 0,1,4,7,9 | 0,3,4,8 | 2,5 |
| BIT# 3 | 0,1,8,9 | 0,2,4,5 | 0,4,7,8,9 | 4,6,9 | 1,2,3,4,7,9 | 0,1,2,5,8 | 1,4,5,9 | 3,6 |
| BIT# 4 | 0,1,2,9 | 1,3,5,6 | 0,1,5,8,9 | 5,7 | 0,2,3,4,5,8 | 1,2,3,6,9 | 0,2,5,6 | 0,4,7 |
| BIT# 5 | 0,1,2,3 | 0,2,4,6,7 | 0,1,2,6,9 | 6,8 | 1,3,4,5,6,9 | 2,3,4,7 | 0,1,3,6,7 | 1,5,8 |
| BIT# 6 | 1,2,3,4 | 0,1,3,5,7,8 | 1,2,3,7 | 0,7,9 | 2,4,5,6,7 | 3,4,5,8 | 0,1,2,4,7,8 | 2,6,9 |
| BIT# 7 | 2,3,4,6,7,9 | 4,6,7,8 | 1,2,3,5,6,9 | 0,3,6,8,9 | 1,3,4,5 | 2,4,6,7 | 3,5,6 | 0,7 |
| BIT# 8 | 3,4,5,7,8 | 0,5,7,8,9 | 2,3,4,6,7 | 1,4,7,9 | 2,4,5,6 | 0,3,5,7,8 | 0,4,6,7 | 1,8 |
| BIT# 9 | 4,5,6,8,9 | 0,1,6,8,9 | 0,3,4,5,7,8 | 0,2,5,8 | 0,3,5,6,7 | 1,4,6,8,9 | 0,1,5,7,8 | 2,9 |

*Fig. 9*

MULTIPLE ERROR DETECTING AND CORRECTING SYSTEM EMPLOYING REED-SOLOMON CODES

CROSS-REFERENCE TO RELATED PATENTS & APPLICATIONS

This invention is related to a commonly assigned copending U.S. application Ser. No. 274,420, filed on June 17, 1981, entitled CIRCUIT FOR SERIALIZING AND DESERIALIZING DIGITAL DATA by Lih-Jyh Weng and Norman A. Field, incorporated herein.

BACKGROUND OF THE INVENTION

This invention pertains to systems for detecting and correcting errors in digital data. More specifically, the invention concerns a system and circuit that implement Reed-Solomon codes for detecting and correcting multiple errors in digital data when transmitted between devices of a data processing system.

Devices of data processing systems and of many communication systems intercommunicate by transmitting and/or receiving digital data signals. These signals generally are electrical or electromagnetic representations of "ones" and "zeroes" and are transferred through a data channel between the devices in a serial or parallel fashion. In data processing systems, the electrical subsystems between the origin of the data and the end user typically constitute the data channel. During transfer of the data, errors sometimes occur. These errors mainly result from inherent or extraneous noise in the data channel. With respect to a magnetic storage device used in a data processing system, such errors can result from defects oftentimes present in the magnetic storage medium, such as, for example, defects in the metal oxide coating. Such defects present error patterns which may be "bursty" in nature; that is, several contiguous errors may occur when retrieving data from a particular location on the storage medium. To render the storage device useful, these error patterns must be corrected, if at all possible. If uncorrectable, the data is permanently lost.

Correction of erroneous data, upon retrieval, is attained by mathematically reconstituting correct code words. To construct a code word, a typical encoder produces parity information, or a checksum word, by sequentially encoding (i.e. mathematically transforming) a fixed number of m-bit symbols, or characters, derived from the original data. Usually, a few bits define a symbol. The checksum word, also comprising a fixed number of m-bit symbols, is then appended to the data symbols thereby to construct the code word. The checksum word, in essence, mathematically characterizes the bit patterns of the original data symbols. Upon receipt or retrieval of that code word, as the case may be, a decoder, using the information contained in the checksum word, examines and manipulates the data bits thereof in a fashion to detect, locate, and/or correct errors occurring therein.

When discussing coding theory, it is common practice to characterize the data words, code words, and checksum words as being a plurality of m-bit binary symbols, each being representative of coefficients of a polynomial in a variable or indeterminent, say "x". The encoder transforms the symbols of each data word to produce symbols of the checksum word, the symbols thereof being elements in the Galois Field $(2^m)$. To facilitate this discussion, we designate the original data word as $d(x)$; the original code word as $w(x)$; the original checksum word as $E(x)$; and the received word as $y(x)$. We define the original code word as being an "$(n-1)^{th}$" order polynomial $w(x) = x^{n-k}d(x) - E(x)$, where $x^{n-k}d(x)$ is a higher order polynomial representing the first "k" high order coefficients of $w(x)$, and $E(x)$ is a lower order polynomial representing the lowest "$n-k$" order coefficients of $w(x)$. The checksum word $E(x)$ is generated by dividing (i.e. encoding) the data word $d(x)$ by a $(n-k)^{th}$ order generator polynomial $g(x)$. Specifically, $E(x)$ is the "remainder" of $x^{n-k}d(x)/g(x)$. Thus, the code word $w(x)$ becomes evenly divisible by the generator polynomial $g(x)$ with a remainder of "zero".

A correctly received word $y(x)$ also is evenly divisible by $g(x)$ because $w(x)$, by the aforementioned definition, is evenly divisible by $g(x)$. So, one well known procedure for detecting errors upon receipt or retrieval of a word $y(x)$ is to divide it by $g(x)$. If the remainder of $y(x)/g(x)$ is "zero", then $w(x)$ is presumed to have been correctly received. If the remainder of $y(x)/g(x)$ is "non-zero", then an error has occurred and an error correction routine is invoked.

The nature of the generator polynomial $g(x)$ determines, among other things, the extent and complexity of the error correction routine. The generator polynomial $g(x)$ is characterized by having roots $\alpha^i$ which are selected elements of the Galois Field $(2^m)$. For most m, there is a very large number of generator polynomials $g(x)$. Selecting a proper generator polynomial $g(x)$ for a given application can sometimes be a difficult task.

Error locations and values are respectively calculated from an error location polynomial and an error evaluator polynomial. These polynomials are computed from error syndromes $S_i$ which are conventionally obtained by dividing the entire received word $y(x)$ by factors of the generator polynomial $g(x)$. Once the error syndromes $S_i$ have been determined, several procedures can be used for computing the error locations and values, the more notable techniques being the Berlekamp-Massey or the Berlekamp decode algorithm for finding the error location polynomial and the Chien's search algorithm for finding error locations. These techniques involve error-location-polynomial determination, root finding for determining the positions of the errors, and error value determination for determining the bit-pattern of the errors. Syndrome computation and root finding are potentially the most time consuming as they involve "n" iterative applications of a basic routine, "n" being the number of symbols in the code word $w(x)$. For long code words capable of enabling correction of many errors, some of these routines presently cannot economically be implemented with electrical components so they usually are performed using a general or special purpose logic processor, such as that described in U.S. Pat. No. 4,162,480 issued to Berlekamp. For additional background information on decoding, reference can be made to "Error Correcting Codes" by Peterson and Weldon, MIT Press, second edition (1972); and "Algebraic Coding Theory", Berlekamp, 1968.

Therefore, in designing and constructing error correcting systems, it is desirable to determine which generator polynomial $g(x)$ provides adequate error correcting power, coding efficiency, and decoding efficiency, and yet be economically and practically implemented with a combination of electrical circuit components and a general purpose logic processor. These factors are particularly critical in their application to high speed data transfers among devices of a data processing system, such as between a direct access disk storage device and a host processor. Coding efficiency, or code rate, is the ratio of the number "k" of data symbols to the number "n" of code word symbols and it varies greatly among the possible generator polynomials g(x). A high rate code is desired, but high rates usually are attained only at the expense of error correcting capability. Further, certain generator polynomials g(x) produce code words w(x) that require substantial decoding time thereby making them unsuitable for real time applications, such as during and between the successive transfers of stored code words from successive data sectors of a magnetic disk storage device. There are yet other generator polynomials g(x) that only can be implemented with inordinately complex and expensive circuits. Accordingly, a code providing high efficiency, sufficient correcting capability, rapid decode properties, and a simple and economical circuit implementation is desired.

In some error correction systems, such as described in U.S. Pat. No. 4,117,458, issued to Burghard, an encoder divides the data word d(x) to produce a code word w(x). The Burghard system uses a nine-stage shift register circuit comprising a feedback path connected to the stages thereof for dividing, by its generator polynomial g(x), a data word symbol as the bits thereof are shifted therethrough. It provides a system that can correct a maximum of two-out-of-eight bits in a symbol that are in error with a coding efficiency of 47% (8 data bits/17 code bits). In the Burghard system, an encoder circuit produces a code word w(x) which embodies a checksum word E1(x). Thereafter, a decoder produces a second checksum word E2(x) by re-encoding (i.e. decoding) the data portion of the received word y(x), and then compares the previously transmitted checksum word E1(x) with the newly generated checksum word E2(x). Different results of comparisons of the checksum words E1(x) and E2(x) uniquely identify a limited number of addresses in a read-only-memory that contain a correspondingly limited number of error patterns in the seventeen-bit code word y(x). To correct errors, these comparisons are correlated with table entries for identifying the locations of the error, and then the bits in the locations in the code word are complemented. In the encoding circuitry, the feedback shift register circuit is constructed so that the result of the comparison of E1(x) and E2(x) resides in the nine-stage shift register circuitry at the end of the re-encoding of the code word. Due to its short code word (seventeen bits) and low code rate, it is apparent that the Burghard system would be suboptimal for application in magnetic storage devices.

U.S. Pat. No. 3,668,632 issued to Oldham implements a Reed-Solomon (63,52) over $GF(2^6)$ error correcting code for use in a digital computer storage system. Its code words y(x) are generated by encoding data words d(x) by a generator polynomial g(x) whose roots comprise 6-bit binary symbols that are elements of Galois Field $GF(2^6)$ generated by the primitive polynomial $x^6+x+1$. With a coding efficiency of approximately 82.5%, it enables correction of five six-bit symbols per code block of sixty-three 6-bit symbols. To determine whether errors exist in the retrieved code words, Oldham uses checksum calculating circuits to divide the entire word y(x) by each factor of the generator polynomial g(x). Other less time consuming measures, such as provided by this invention, could be used for testing the error status of the retrieved code word y(x). Further, Oldham's invention is based on the premise that most errors in computer storage systems occur singularly and that single errors can rapidly be corrected by conventional single error methods (i.e. the single error value V equals the error syndrome $S_0$, and the single error location L equals Log $[S_1/S_0]$). Oldham achieves single error testing by executing a single error correcting routine and re-reading to validate an assumption of a single error. This procedure is relatively time-consuming. Oldham also attempts re-reads and recalculating syndromes many times in hopes of obtaining data having only a single rapidly correctable error. If this procedure is unsuccessful, the Oldham system proceeds to the next time consuming conventional correction routine of simultaneously solving a system of linear equations for identifying error locations and values. Thus, it is evident that the Oldham system would induce substantial delays in the retrieval of information from a storage device in a data processing system.

U.S. Pat. No. 4,142,174 issued to Chen, et al describes a high speed decoding method for Reed-Solomon code words having 8-bit symbols. During decoding, in order to test the code word for the presence of a single error, Chen, in a three-symbol correction system, tests whether $S_2 + K\ S_1 = 0$ and $S_3 + K\ S_2 = 0$, where $K = S_1/S_0$. If this condition is true, then a single error is presumed to exist and the conventional single error location and value determination routine is performed.

For additional background information relative to the state of the art, reference may be had to "The Technology of Error-Correcting Codes", Elwyn R. Berlekamp, Proceeding of the IEEE, Volume 68, No. 5, May 1980.

In view of the foregoing, a broad objective of this invention is to provide an economical system and circuit for efficiently detecting and correcting digital data that has become corrupted during transmission or storage.

Another objective of this invention is to provide a time-wise efficient decoding method for detecting and correcting multiple errors occurring in binary data transferred between devices of a data processing system.

Another objection of this invention is to provide an error detecting and correcting system for rapidly decoding relatively long code words using a general purpose or special purpose logic processor for computing error syndromes, as opposed to a table look-up technique which is impractical for such code words.

Another objective of this invention is to provide a system which rapidly indicates the error status of a retrieved code word in order for immediately indicating the correctness of a retrieved data word and for bypassing the error correction routine when the retrieved data word is correct or otherwise uncorrectable.

Another objective of this invention is to provide a method and apparatus for rapidly determining whether a single symbol error exists in a received word so that an abbreviated decode algorithm can be used.

Another objective of this invention is to provide an economical circuit having a minimum number of electrical circuit components for rapidly encoding and decoding relatively long code words.

A further objective of this invention is to provide a simple electrical circuit that implements a particular encoding scheme possessing high coding efficiency and high correcting power.

A more specific objective of this invention is to provide a system arrangement including an error detecting and correcting circuit and a controller therefore in the interconnection between a data processing system and a magnetic storage device thereby to enable real time encoding and decoding of data during its transfer between the data processing system and successive data sectors of a magnetic disk storage device.

Other objectives either are stated in the following description or will become evident in view of the description of the succeeding illustrative embodiment.

SUMMARY

In accordance with one aspect of this invention, a data processing system transmits data words d(x) to a magnetic data storage device. In the data transmission path between the storage device and the data processing system, a Reed-Solomon encoder generates a code word w(x) by encoding the data word d(x) thereby to produce a checksum word E(x). The code word w(x) is stored in the magnetic disk storage device as a stored word y(x) comprising a data portion c(x) and a checksum portion E1(x) which correspond with d(x) and E(x), respectively. Upon retrieval of the data word y(x) from the storage device, the data portion c(x) thereof is simultaneously transferred to a data buffer and encoded with the same Reed-Solomon encoder that was used during the encoding of d(x) to produce a second checksum word E2(x). The symbols of both checksum words E1(x) and E2(x) are exclusive "OR'ed" (i.e. compared) to produce an ECC residue R(x) from which error syndromes $S_i$ can be computed. The residue R(x) is tested within the circuit to determine if it equals "zero". If so, it is assumed that no errors exists. If it is not "zero", an error is assumed and a logic processor operates on the residue R(x) to produce the error syndromes $S_i$ thereby to enable the computation of error locations and values, if errors exist. Once the error locations and value are determined, the data word c(x) in the buffer is corrected and returned to the data processing system. The provision of the residue R(x) enables more rapid error detection and use of less circuitry for computing error syndromes.

Sometimes errors occur in the retrieved checksum word E1(x), but not in the data word c(x). This condition would indicate an apparent error as the comparison of E1(x) and E2(x) would produce a non-zero residue R(x) and thereby cause the system to unnecessarily invoke the decoding routine. So, in order to bypass the decoding routine when this condition arises, another aspect of this invention provides for the counting of the number NR of non-zero symbols in the residue R(x). Assuming a distance of (2T+2) and the residue comprising (n−k) symbols, if NR is less than or equal to T, then an error monitor produces a first control signal indicating no errors in the symbols of the data portion c(x) of the retrieved code word y(x). The data word c(x) then is immediately transferred to the data processing sytem. If NR equals T+1, the error monitor produces a second control signal indicating that the error is uncorrectable (i.e. contains more than T errors). The data processing system either again reads the stored code word y(x) on one or more occasions and/or abandons further attempts to retrieve the data. If NR is greater than or equal to T+2, the error monitor produces a third control signal indicating that correctable errors probably exist in the data word c(x), in which case, a single error or multiple error correction routine is initiated.

Another aspect of the invention comprises the use of a single-error test procedure for quickly determining whether single errors exist in the data word c(x) when retrieved. Single errors can be corrected with minimal delay in completing the transfer of data to the data processing system. After the immediate determination of the error syndromes $S_i$ from the residue R(x) in accordance with the above mentioned aspect of this invention, the system tests whether the syndromes relationship $S_{i+1}/S_i$, for all syndromes $S_i$, is constant. If this condition holds true, a single error is presumed to have occurred and it is immediately corrected by conventional techniques.

The invention employs a Reed-Solomon encoder to produce code words w(x) having 10-bit wide binary symbols from data words d(x) also having 10-bit wide binary symbols wherein the generator polynomial g(x) that encodes the data words is characterized by having roots $\alpha^i$ in the Galois Field ($2^{10}$) that is generated, in one embodiment, by the primitive polynomial:

$$x^{10}+x^3+1,$$

and in another embodiment, by the primitive polynomial:

$$x^{10}+x^7+1.$$

The above and further objects, advantages and aspects of this invention may be attained by referring to the following detailed description taken in conjunction with the accompanying drawings. This scope of invention, however, is pointed out with particularity in the appended claims.

DESCRIPTION OF AN ILLUSTRATIVE EMBODIMENT

Figure 1:
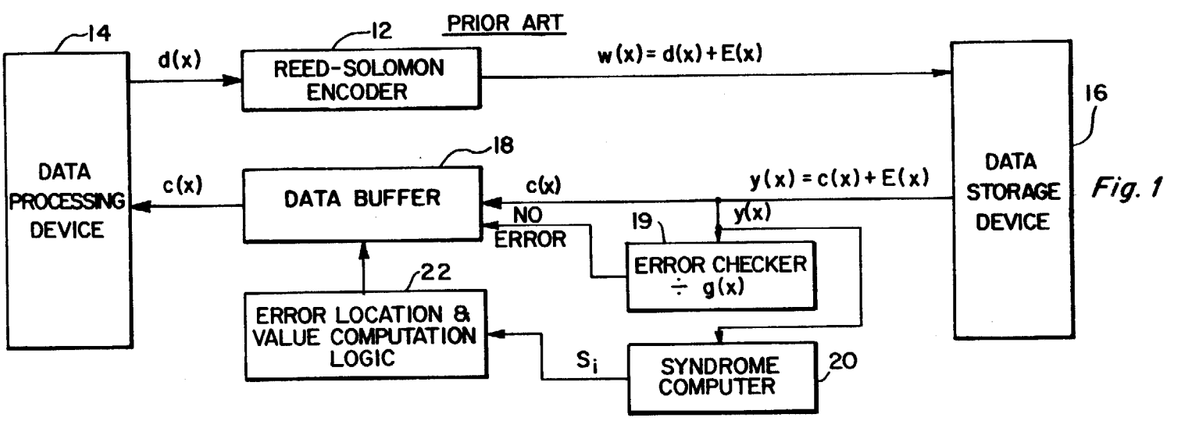
FIG. 1 depicts a prior art structure of an error correcting and detecting system over which this invention is an improvement.
Figure 2:
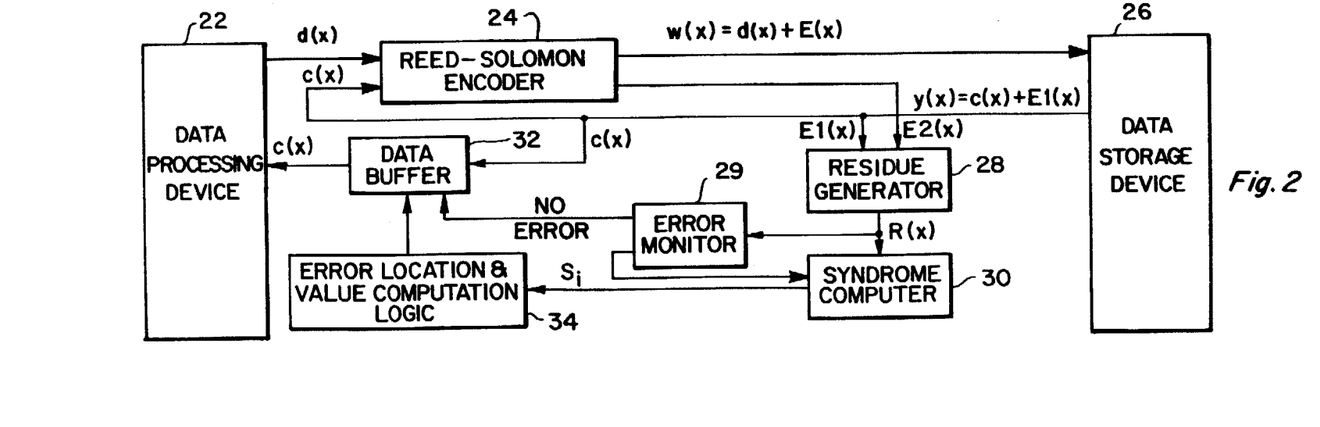
FIG. 2 depicts a preferred structure of an error correcting and detecting system constructed in accordance with this invention.

FIGS. 1 and 2 illustrate some basic differences between this invention and a prior art system of the type employing a syndrome computer. The prior art system depicted in FIG. 1 includes a Reed-Solomon encoder 12 that encodes data words d(x) emanating from a data processing device 14 thereby to produce code words w(x) which are transferred to a data storage device 16. The code words w(x) are constituted by the data word d(x) and a checksum word E(x) appended thereto. Upon retrieval of the word y(x) that was previously stored as w(x) in the data storage device 16, a data portion c(x) thereof is transferred to a data buffer 18 and a decoder 19 divides the entire y(x) by the generator polynomial g(x) that was used in the encoder 12 to determine whether it is evenly divisible. If y(x) is evenly divisible, then a NO ERROR signal produced therefrom effects a transfer of the data word c(x) from the data buffer 18 to the data processing system 14. If y(x) is not evenly divisible by g(x), then the syndrome computer divides y(x) by each factor $g_i(x)$ of g(x) for producing error syndromes $S_i$. As previously indicated, the error syndromes $S_i$ bear a certain relationship with the location and value of errors occurring in the data word c(x) then present in the data buffer 18. The amount of time required for computation of these syndromes $S_i$ depends upon the code word length and the error correcting power of the code. These syndromes are usually calculated by a special purpose digital computer, such as described in U.S. Pat. No. 4,162,480 issued to Berlekamp, or by using a hardware circuit provided that there are only a few symbols are decoded.

Once these syndromes are computed, they are transferred to an error location and value computation logic circuit 22 which computes the precise locations and values of the errors occurring in the data word c(x). The circuit 22 thereafter produces error location and value signals which are applied to the data buffer 18 for correcting the errors therein. A corrected data word c(x) is then transferred to the data processing system 14.

Several improvements over the prior art system are shown in the inventive embodiment depicted in FIG. 2. Its data processing system 22, encoder 24, data storage device 26 and data buffer 32, operate similar to the corresponding components of FIG. 1. The operation and structure of some of these components are, however, different and do form part of the invention herein. We explain those differences as follows.

According to this invention, upon retrieval of a data word y(x) from the data storage device 26, a residue generator 28 produces a residue R(x) by exclusive OR'-ing the checksum word E2(x) and the previously stored checksum word E1(x). The checksum word E2(x) is produced by again encoding the retrieved data word c(x) by the same encoder 24 that encoded d(x). The newly generated checksum word E2(x) equals the "remainder" of $x^{n-k}c(x)/g(x)$. Using this residue R(x), we conceived that error syndromes $S_i$ could be computed by dividing R(x) by factors $g_i(x)$ of the generator polynomial g(x), and still obtain the same syndromes $S_i$ that would be produced by dividing the entire received word y(x) by the factors $g_i(x)$. With this concept, we constructed an error correcting system employing means for computing syndromes to find error locations, as opposed to a table look-up procedure. Accordingly, we can implement Reed-Solomon codes that have a much higher error correcting capability, which codes cannot be practically implemented using a table look-up procedure due to the inordinately large table of error patterns.

Further, if the checksum word E2(x) is the same as the previously recorded checksum word E1(x), then the residue R(x) is zero and the received code word y(x) is presumed equal to the transmitted code word w(x) thereby indicating that the received data word c(x) is also equal to the original data word d(x). If E2(x) is different from E1(x), then a transmission error is presumed to have occurred.

In our specific embodiment, the Reed-Solomon encoder 24 also performs the function of the residue generator 28. The syndrome computer 30 receives and divides the residue R(x) by factors $g_i(x)$ of the generator polynomial g(x) for producing the same syndromes $S_i$ that would be produced by dividing the entire word y(x) by factors $g_i(x)$ of g(x). Production of syndromes from the residue R(x) is much faster since it has fewer terms, e.g. at most, only the number of symbols of the checksum word. When the syndrome computer 30 computes the syndromes $S_i$, the error location and value computation logic circuit 34 receives them and determines the locations and values of the errors in the data word c(x). Thereafter, the logic circuit 34 supplies the appropriate correction signals to the data buffer 32 for correcting the errors in the retrieved data word c(x). The corrected data word c(x) is then transferred from the buffer 32 to the data processing system 22. So, whether the syndrome computer 30 comprises a general purpose logic processor or a special purpose hardware circuit, computation of syndromes $S_i$ can be performed much faster from the residue R(x) than by conventional techniques.

Sometimes errors occur in the retrieved checksum word E1(x), but not in the data word c(x), in which case it would not be necessary to invoke the error correction routine. Prior art systems do not provide for determining this condition until after computing the error location polynomial by engaging the circuits 34 or 22. In accordance with another improvement provided by this invention, an error monitor 29 produces error status control signals in response to a number "NR" of non-zero symbols in the residue R(x). We have found a unique relationship between the number NR of non-zero symbols in the residue R(x) and relative location and number of errors in the word y(x).

Noting that the residue R(x) comprses (n−k) symbols (in our case, n−k=2T+1), if NR is less than or equal to T, then the error monitor 29 produces a NO ERROR control signal for indicating no errors in the symbols of the data portion c(x) of the retrieved code word y(x). The NO ERROR signal is applied to the data buffer 32 thereby to effect an immediate transfer of the data word c(x) in the buffer 32 to the data processing system without invoking any of the time-consuming decoding or correction routines.

If NR equals T+1, the error monitor 29 generates another control signal indicating that c(x) is uncorrectable (i.e. contains more than T errors). This signal is supplied to the syndrome computer 30 to avoid invoking the decoding or correction routines. Instead, a controller for the data storage device attempts to re-read the word y(x) or, after a number of unsuccessful re-read attempts, abandons the task and records a "bad block" message in a status file associated with the storage device. Without the provision of the error monitor 29, it would be necessary to more frequently expend processing time to compute syndromes and the error location polynomial for determining whether y(x) is correctable. Specifically, the degree of the error location polynomial indicates whether the code word y(x) is correctable.

If NR is greater than or equal to T+2, the error monitor 29 produces another control signal indicating that potentially correctable errors exist in the data word $c(x)$, in which case, a single or multiple error correction routine is begun. Of course, if the residue $R(x)$ is "zero", then there are no errors in retrieved $c(x)$ or $E1(x)$, and $c(x)$ can be immediately transferred from the buffer 32 to the data processing system 22.

Figure 3:
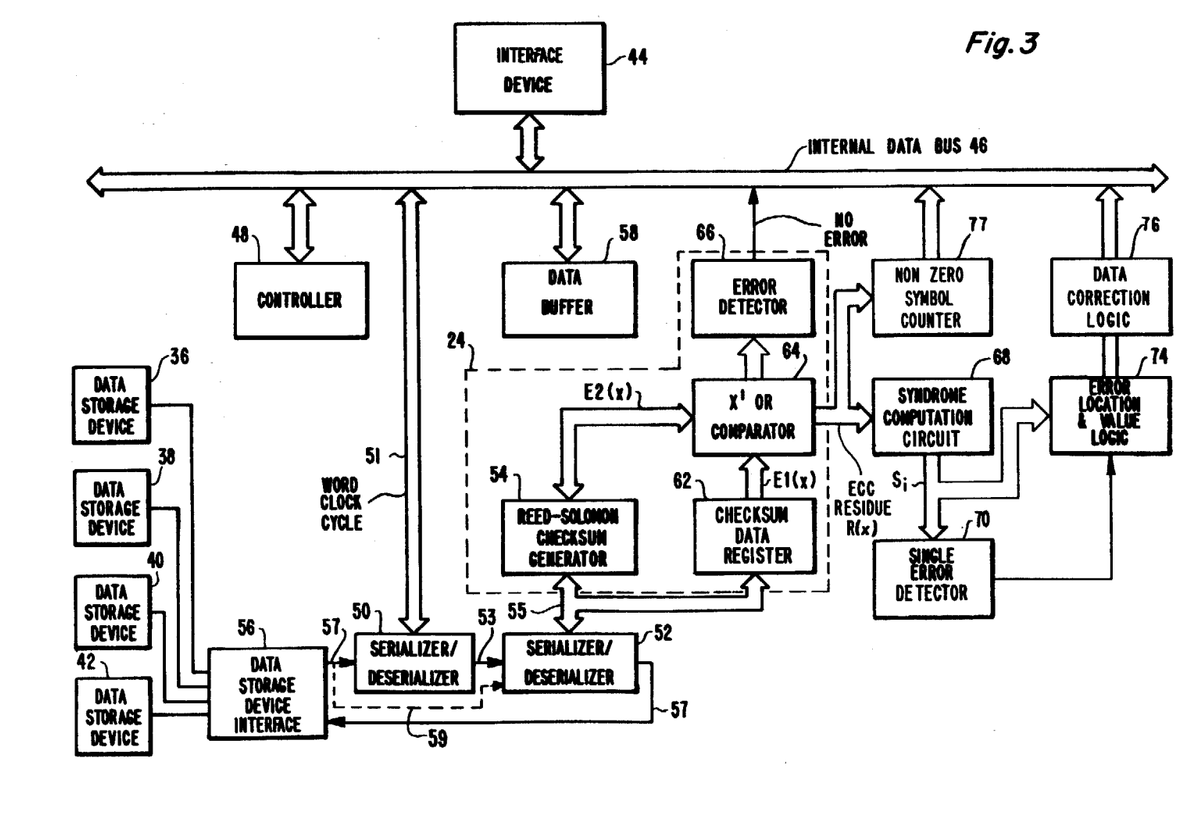
FIG. 3 shows the invention coupled with a data storage facility.

FIG. 3 depicts a preferred structure of the error correcting and detecting circuitry that we utilize in a data processing system including data storage means, such as devices 36 through 42. The system includes an interface device 44 that communicates with other data processing devices, such a central processor unit or a storage bus controller. The interface 44 operates to transfer storage data to one of the data storage devices 36 through 42 by placing storage data signals, together with other transfer control signals, on an internal data bus 46. The transfer control signals usually identify the source and destination of the storage data signals placed on the bus 46. The internal data bus 46 comprises a number of parallel conductors for carrying this information to all devices connected thereto. On a writing operation, for example, the interface 44 transmits and places signals representing symbols of a data word $d(x)$ and writing control signals on the bus 46. A controller 48 responds to the writing control signals by activating a serializer/deserializer (SERDES) circuit 50. The SERDES circuit 50 converts parallel data into serial data bits which ultimately are transferred to a selected one of the storage devices 36 through 42 under control of a device interface 56. The SERDES circuit 50 includes a parallel port for receiving 16-bit wide data words over a parallel connection 51 and then transmits these parallel words as a stream of serial data bits from its serial connection 53 to a second SERDES circuit 52. The structure of the SERDES circuits 50 and 52 are described in a commonly assigned co-pending U.S. application Ser. No. 274,420, entitled CIRCUIT FOR SERIALIZING AND DESERIALIZING DIGITAL DATA by Lih-Jyh Weng and Norman A. Field, incorporated herein.

The SERDES circuit 52 simultaneously performs two functions during a writing operation. First, it supplies 10-bit wide symbols from the serial data stream to the encoder 24 via a parallel connection 55, and second, it passes the serial data bits to the device interface 56 via its serial output connection 57. A predetermined number of the 10-bit wide symbols constitutes a data word $d(x)$. A convenient predetermined number of 10-bit symbols is that which can conveniently be stored in one sector or data block of the data storage devices 36 through 42. The specific encoder 24 employed permits $y(x)$ to include up to one thousand and twenty-three symbols inclusive of the checksum symbols. When the predetermined number of symbols have been transferred to and encoded by the encoder 24, the controller 48 halts further inputs of data to the SERDES circuits 50 and 52, and then conditions the Reed-Solomon encoder 54 to shift the 10-bit symbols of the checksum word $E(x)$ then present in the registers thereof to the SERDES circuit 52. This occurs on the next symbol clock cycle while the passage of the last symbol of the data word $d(x)$ through the circuit 52 is occurring and thus enables a time-wise continuous transfer of the symbols that make up the code word $w(x)$. The code word $w(x)$ is thus a concatenation of the symbols of $d(x)$ and $E(x)$ and is serially transferred to the interface 56 via the serial connection 57 where it is stored in a selected device 36 through 42. The other circuits in the error correcting and detecting system are not utilized during a writing operation to the data storage devices.

During a reading operation, that is, a transfer of information from the data storage device 36 through 42 to the interface device 44, the code word $w(x)$ that was previously stored in the data storage devices is retrieved as a code word $y(x)$. It comprises a data word $c(x)$ and a checksum word $E1(x)$, both corresponding to the data word $d(x)$ and the checksum word $E(x)$. To start a reading operation, the controller 48 issues an instruction to the interface 56 which supplies, in serial form, the retrieved code word $y(x)$ to the serial input connection 57 of the SERDES circuit 50. The SERDES circuit 50, like the SERDES circuit 52, then simultaneously performs two operations. First, it transfers 16-bit wide parallel words in the serial data stream emanating from the device controller 56 to a data buffer 58. This transfer is made via the connection 51 and the data bus 46. Second, it passes the serial data bits to the SERDES circuit 52 via either connection 59 or 53, which supplies 10-bit wide symbols to the encoder 24 in the same fashion previously described. The encoder 24 encodes these 10-bit wide symbols of $c(x)$ to produce a second checksum word $E2(x)$. immediately after the data word $c(x)$ is encoded, the controller 48 enables the stored checksum word $E1(x)$ appended to the data word $c(x)$ to enter into the encoder 24. At the instance that the symbols of the data word $c(x)$ have completed entry into the encoder 24, a newly generated checksum word $E2(x)$ will then be present in the stages of the encoder 24. At this juncture, the encoding process is terminated while the appended checksum word $E1(x)$ continues to enter the encoder 24. As will subsequently be explained, the encoder 24 is constructed so that the residue $R(x)$ results from the continued passage of the symbols of $E1(x)$ into the encoder 24 while $E2(x)$ is present therein. Thus, it is seen that the encoder 24 also performs the function of the residue generator 28 (FIG. 2), the exclusive OR comparator 64, and the error detector 66. The retrieved checksum word $E1(x)$ could also have been stored in a checksum data register 62 for comparison with the newly generated $E2(x)$.

As peviously explained, the error detector 66 monitors the presence of any non-zero symbols in the residue $R(x)$ and the non-zero symbol counter 77 monitors the number NR of non-zero symbols in the residue $R(x)$ for generating control signals that control the overall operation of the circuit depicted in FIG. 3. If NR is less than the previously identified "T", then the controller 48 immediately tranfers the data word $c(x)$ in the data buffer 58 to the interface device 44 without engaging the error correction routines. If NR equals T+1, a control signal indicating $c(x)$ to be uncorrectable is transmitted to the controller 48 by the error detector 66 via the data bus 46. This control signal enables the controller 48 to re-read the uncorrectable data sector without attempting to decode the otherwise uncorrectable errors in the data word $c(x)$. If NR is greater than or equal to T+2, the syndrome computation logic 68 is activated and the error recovery routines are engaged. Error recovery proceeds as follows.

The syndrome computation logic 68 computes the error syndromes $S_i$, for $i = -T$ to $+T$. The error syndromes are generated from elements of the residue $R(x)$ by forming $R(\alpha^i)$, for $i = -T$ to $+T$. The order of the residue $R(x)$ is equal to the order of the stored checksum symbols $E1(x)$ (in our preferred embodiment, the order is seventeen) so the syndromes can be computed relatively quickly. In prior art systems, the error syndromes are produced by dividing y(x) directly by factors $g_i(x)$ of the generator polynomial g(x), so a much longer-time results. The word y(x) could have as many as one thousand and twenty-three terms. So it is seen that the provision of a residue R(x) provides a much faster method of computing the error syndromes and that substantial computation time is saved during the computation of the error syndromes $S_i$. In our preferred embodiment, the error syndromes $S_i$ are generated by a data processing device, such as an LSI-11 processor, manufactured by the assignee hereof. These syndromes could as well be produced by electrical circuit components specially constructed to perform division by factors $g_i(x)$ of g(x).

After the syndromes $S_i$ are computed, the single error test logic circuit 70, according to another aspect of this invention, initiates a unique single error test procedure. If only a single error exists, it can quickly be corrected and thereby enable substantially immediate transfer of the data word c(x) from the data buffer 58 to the interface device 44. For a single error, it is well known that:

$$S_0 = \text{remainder }[y(x)/g_0(x)] = \text{remainder }[R(x)/g_0(x)],$$

and that:

$$S_0 = V,$$

where "V" is the value of the single symbol in y(x) in error. It is also well known that:

$$S_1/S_0 = \alpha^L,$$

where "L" is the location of the symbol in y(x) that is in error. While $$S_i = \alpha^{iL} V,$$

it is seen that $$S_{i+1}/S_i = \alpha^{(i+1)L} V/\alpha^{iL} V = \alpha^{(i+1)L}/\alpha^{iL},$$

for all i. But $$\alpha^{(i+1)L}/\alpha^{iL} = \alpha^L = \text{constant}.$$

From the foregoing, it only is necessary to test whether $S_{i+1}/S_i$ is constant for all i. If this condition holds true, then it is known that a single error exists.

To expedite this testing procedure, the syndrome computation logic 68 and the single error detecting logic 70 use Galois Field log and anti-log tables of all symbols in $GF(2^{10})$ for producing multiplication and divisions therebetween. In this case, the use of look-up tables for a limited number of entries enables determination of products and divisions much faster than other means of performing Galois Field operations. This test is made by the logic circuit 70 in a very short period of time so that error location and error value signals can immediately be supplied by the error location and value logic 74 to the data correction logic 76. The data correction logic 76 places the correction signal together with the appropriate identification signals on the data bus 46 thereby to effect correction of associated c(x) in the data buffer 58. Thereafter, the corrected c(x) is transferred to the interface device 44.

If, on the other hand, the single error test failed, the error location and value logic 74 initiates convention error correction routines, such as the aforementioned Berlekamp-Massey or Berlekamp decode algorithm and the Chien's search algorithm, to locate and evaluate the errors in the data word c(x). The aforementioned look-up tables also are used to reduce computing time. When the errors are determined, the correction logic circuit then corrects the errors in the data buffer 58.

Figure 4:
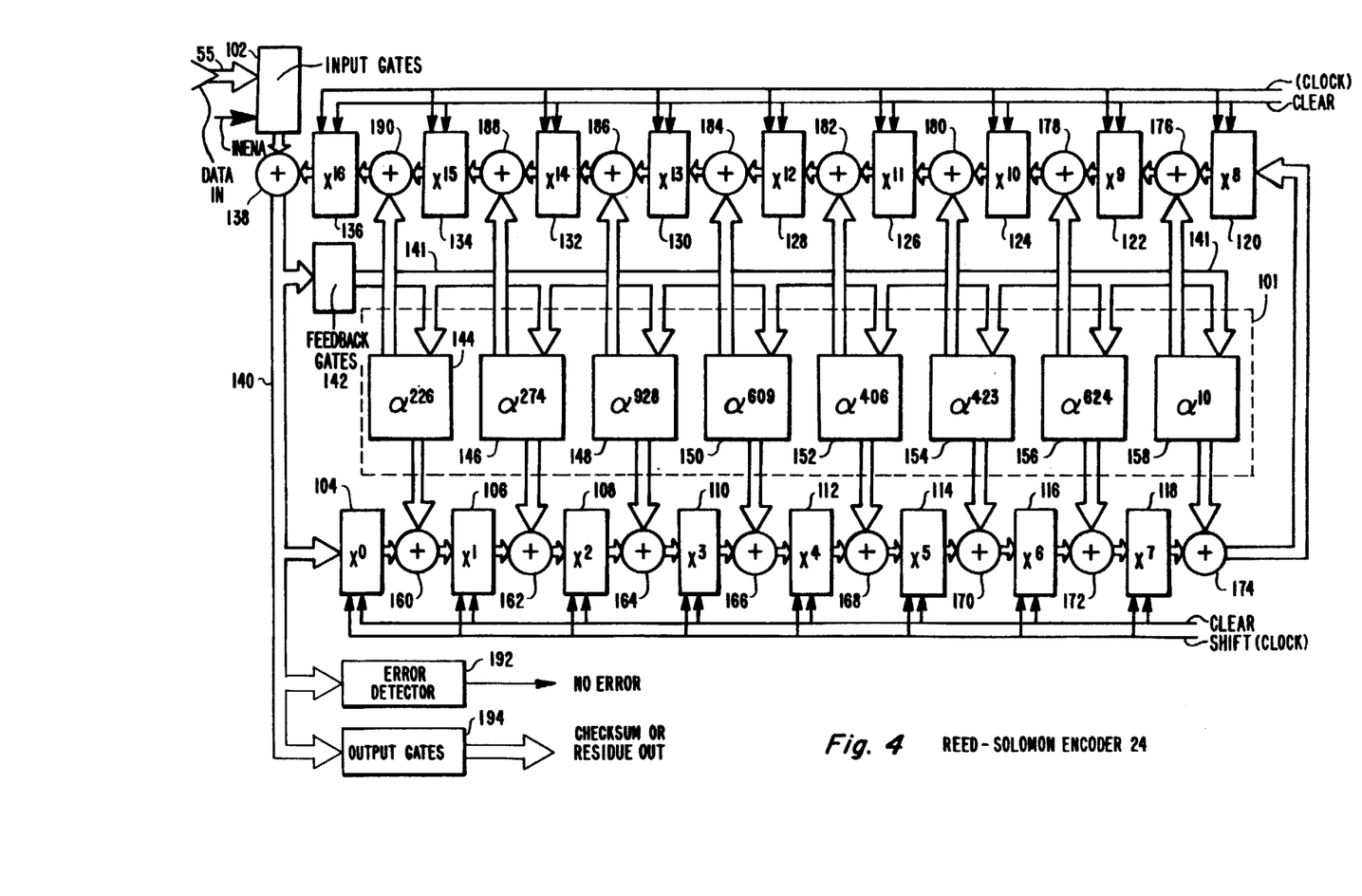
FIG. 4 depicts the preferred Reed-Solomon encoding circuitry that is used in the data processing system of FIG. 3.
Figure 5:
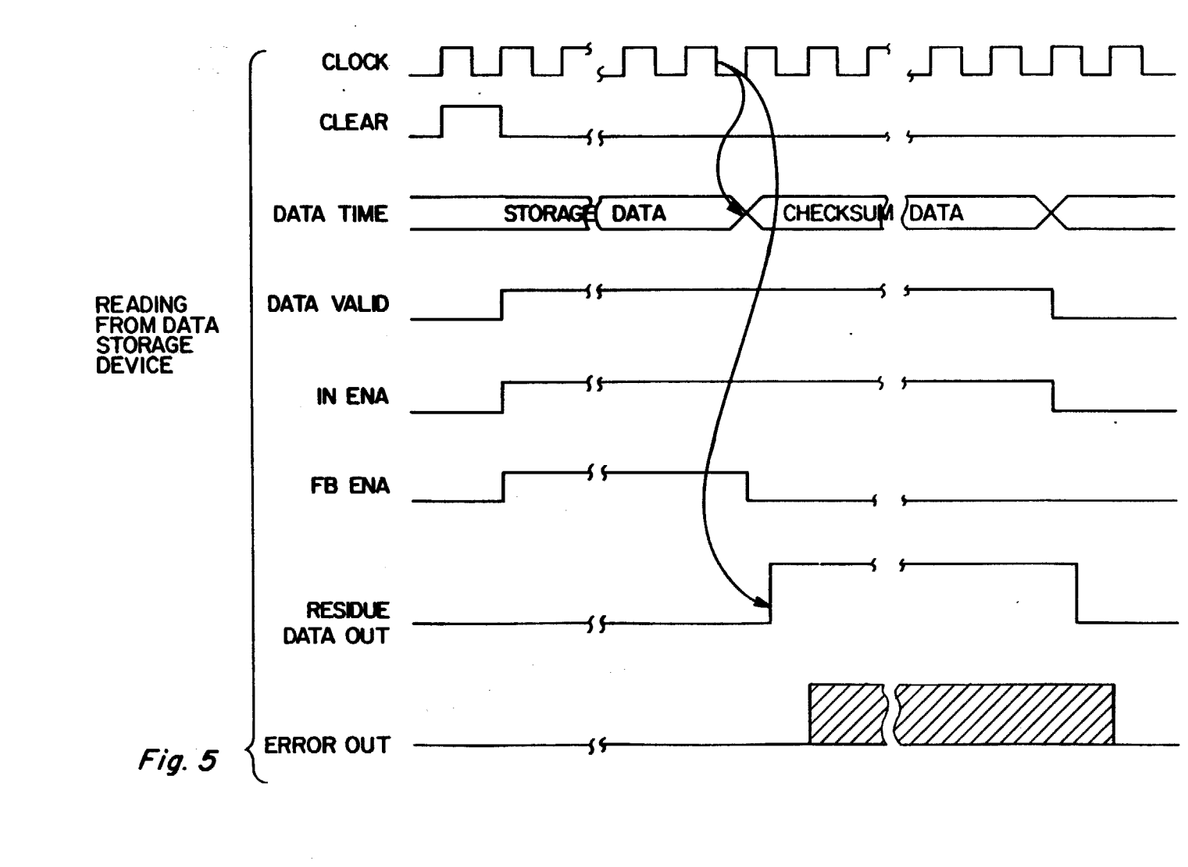
FIGS. 5 and 6 depict timing diagrams that illustrate the operation of the encoding circuit of FIG. 4.
Figure 6:
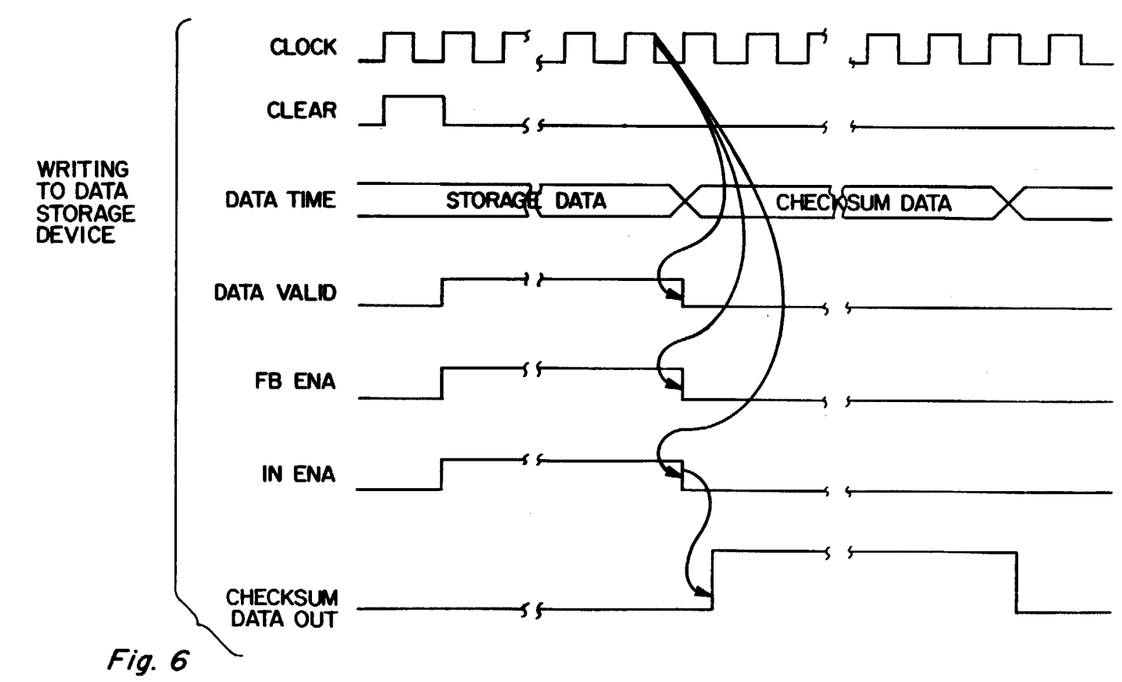

FIGS. 4, 5 and 6 together show the Reed-Solomon generator 28 of FIG. 2 and timing diagrams for both writing and reading operations. The encoder circuit 28 produces code words w(x) by dividing the symbols of a data word d(x) or c(x), as the case may be, received at connection 55 by a generator polynomial g(x) characterized by having roots $\alpha^i$ in the Galois Field $GF(2^{10})$. The Galois Field is generated by the primitive polynomial $x^{10}+x^3+1$. We chose seventeen factors $g_i(x)=(x+\alpha^i)$, $i=-8$ to $+8$, to comprise g(x) for providing an error correction capability of eight symbols in error and the capability of detecting nine symbols in error. Since we use 10-bit wide symbols, we can correct up to eighty bits in error in each data sector of the storage devices and detect up to ninety bits in error. Thus, $$g(x) = \prod_{i=-8}^{+8} (x + \alpha^i), \text{ or}$$

$$g(x) = (x + \alpha^{-8})(x + \alpha^{-7}) \ldots (x + \alpha^7)(x + \alpha^8),$$

and when the multiplication is carried out, $$g(x) = x^{17} + \alpha^{226}x^{16} + \alpha^{274}x^{15} + \alpha^{928}x^{14}$$
$$+ \alpha^{609}x^{13} + \alpha^{406}x^{12} + \alpha^{423}x^{11} + \alpha^{624}x^{10}$$
$$+ \alpha^{10}x^9 + \alpha^{10}x^8 + \alpha^{624}x^7 + \alpha^{423}x^6$$
$$+ \alpha^{406}x^5 + \alpha^{609}x^4 + \alpha^{928}x^3 + \alpha^{274}x^2 + \alpha^{226}x + 1.$$

Each coefficient of g(x) is applied to two shift register stages in the feedback network 101 to reduce the number of circuit components required therein. After all symbols of the data word d(x) have shifted into the circuit 28, seventeen 10-bit wide symbols of a checksum word E(x) will reside in the stages 104 through 136 thereof. Up to one thousand and six 10-bit data symbols of a data word d(x) can be encoded by the circuit 28.

To initiate the encoding process on a reading cycle, the controller 48 (FIG. 3) issues a CLEAR signal in order to clear the contents of the stages 104 through 136 of the shift register and the contents of the error detector 192. On the next CLOCK pulse after the CLEAR signal, the controller asserts an IN ENA signal which conditions the input gates 102 to pass 10-bit wide binary symbols of d(x) from the parallel connection 55 of the SERDES circuit 52 to a half-adder circuit 138. Half-adders essentially are modulo-two adders and comprise a group of exclusive OR gates, one being associated with each pair of respective bits from the connection 55 and the stage 136. The CLOCK pulses also are applied to the shift registers 104 through 136 to cause a shift from one stage thereof to a succeeding stage thereof. The controller 48 also asserts a FB ENA signal to enable the coefficients, i.e. symbols, of d(x) to be successively fed to the stage 1 of the encoder. While being fed to the encoder 24, the coefficients of generator polynomial g(x) are applied to the feedback connections in the feedback circuit 101 so as to effect polynomial division of d(x) by g(x) thereby to produce a remainder; that is, the checksum word E1(x), a lower order polynomial. To enable feedback, the FB ENA signal conditions the feedback gate circuit 142 to pass the bits of each symbol of d(x) in parallel to each of the multiplier circuits in the feeback circuit 101. Once the generator polynomial has been determined, the manner of constructing feed back connections a straight forward procedure that is well within the skill of a coding theorist.

Figure 7:
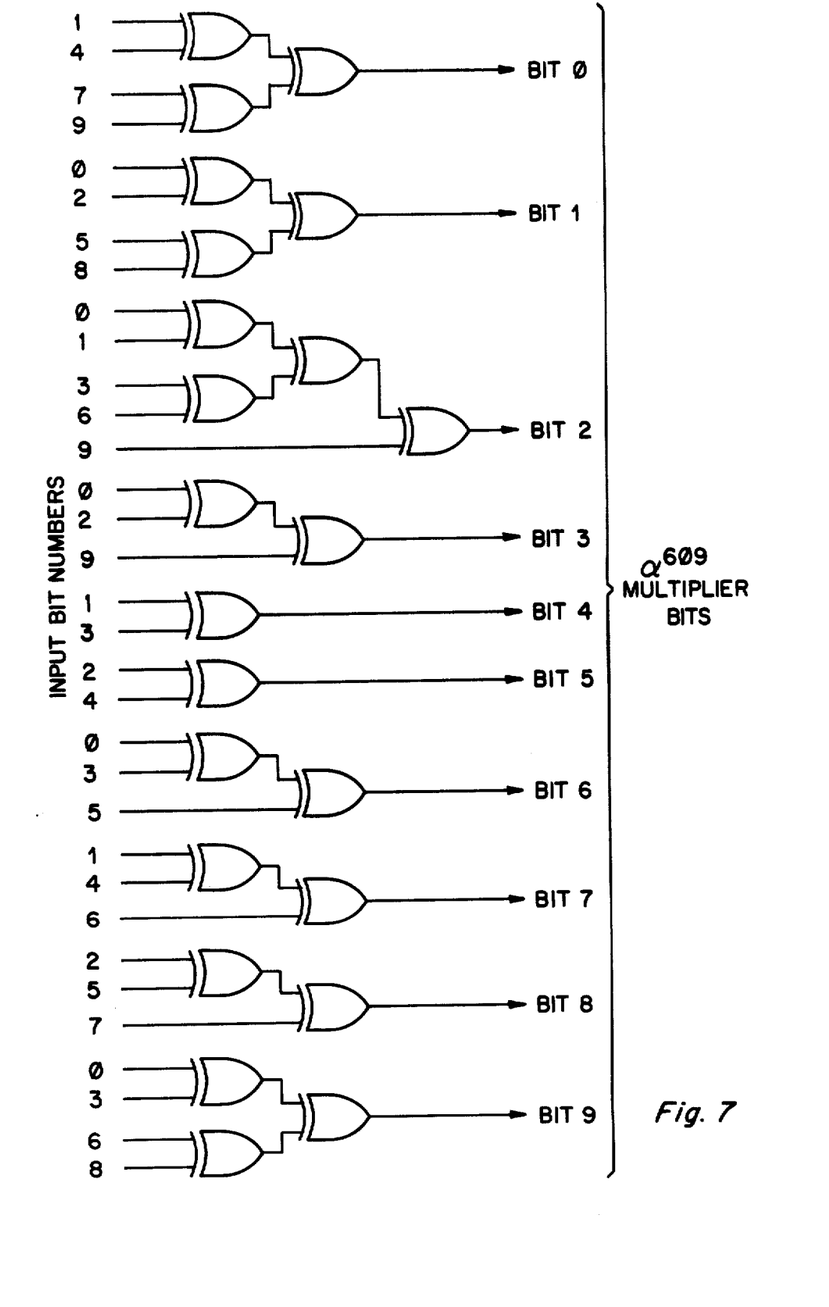
FIG. 7 illustrates a typical one of the feedback multiplier circuits use in the encoding circuit of FIG. 4.
Figure 8:
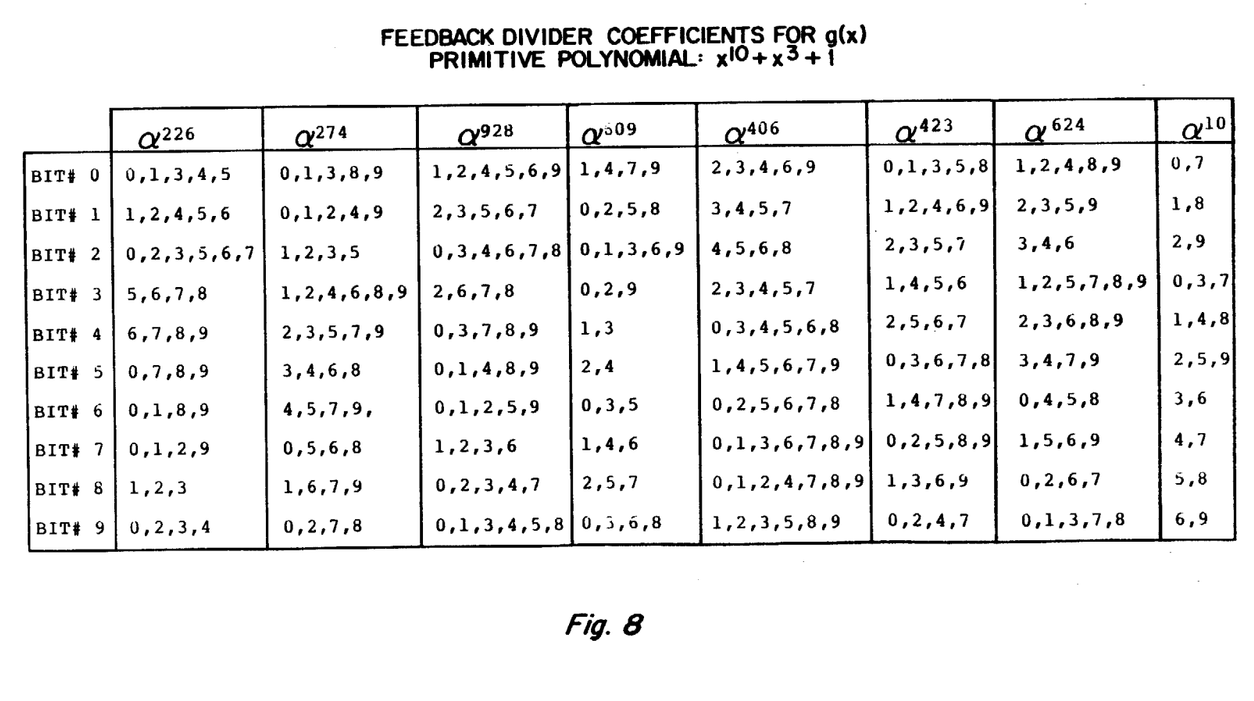
FIG. 8 is a table showing the feedback interconnections for all of the feedback multiplier circuits depicted in FIG. 4 for the primitive polynomial $x^{10}+x^3+1$.

A typical one of the multiplier circuits representing the coefficients in the feedback circuit 101, such as $\alpha^{406}$, is depicted in FIG. 7. The coefficient $\alpha^{406}$, as well as each of the remaining multiplier coefficients in the feedback circuit 101, is constructed according to the bit multiplier table shown in FIG. 8. For each coefficient $\alpha^i$ of g(x), the entries of the table in FIG. 8 identify the bit positions of the conductor 141 that are applied to the exclusive OR gates as shown in FIG. 7. The ten output bits, such as shown in FIG. 7, are then applied to the half-adders 160 through 190 as shown in FIG. 4. As previously mentioned, the Reed-Solomon encoding circuit 100 produces n−k checksum symbols E(x) from k 10-bit data signals d(x). After "n" successive symbol CLOCK pulses, the circuit 100 will have produced n−k checksum symbols E(x) at the output gate 194. These checksum symbols will also residue in successive stages $x^0$ through $x^{16}$ of the circuit 100.

After the k data word symbols of d(x) have been serialized and transferred to the device controller 56 via the serial conductor 57 (FIG. 3), the FB ENA and the IN ENA signals are negated whereupon the contents of stages 104 through 136 are transferred successively, beginning with the next CLOCK pulse, to the SERDES circuit 52 for subsequent transfer to the data storage devices via serial conductor 57. These checksum symbols are noted E(x) and are stored in the data storage devices together with the symbols of the data word d(x). We refer to the stored code word as w(x).

Upon retrieval, the device interface 56 serially transfers a word y(x) that was previously stored as w(x) to the SERDES circuit 50 which picks off sixteen-bit parallel words via connection 51 under control of the controller 48. The controller 48 stores these 16-bit parallel words in the data buffer 58. The SERDES circuit 50 also serially passes the retrieved code word y(x) to the SERDES circuit 52 which passes 10-bit wide symbols of y(x) to the encoder 28. In a variation of the preferred embodiment, both the SERDES circuits 50 and 52 receives serial data from the device interface 56, in which case, the SERDES circuit 52 is provided with an additional serial input connection 59. Prior to receiving the first symbol of y(x), a CLEAR signal issued by the controller 48 clears the stages 104 through 136 of the encoder 28. On the next assertion of the CLOCK pulse, the IN ENA and the FB ENA signals become asserted thereby enabling the encoder 28 to re-encode the symbols of the data word c(x). Each assertion of a CLOCK pulse shifts a 10-bit symbol of c(x) into the input gate 102 and through the stages 104 through 136 while the feedback circuit 101 permits the appropriate polynomial division of c(x) by g(x) as previously explained.

After k symbols of y(x) (e.g. c(x)) have been shifted into the encoding circuit 28, the FB ENA signal is negated thereby to disable the feedback gates 142. However, a continuation of the CLOCK pulses causes the previously recorded symbols of the checksum word E1(x) that were concatenated with c(x) to continue to enter the encoder 28 through the INPUT GATE 102. The k symbols of the data word c(x) that were shifted through the encoding circuit 28 produce a second set of checksum symbols E2(x) which, if correct, would be equal to the previously recorded set of checksum symbols E1(x). The construction of the feedback circuit 28 provides, through the exclusive OR gate 138 and with the FB ENA signal negated, an exclusive OR comparison between the symbols of E2(x) then present in the stages 104 through 136 of the shift register and the symbols of the previously recorded symbols of E1(x) that are being fed to the exclusive OR gate 138. The results of this comparison; that is the residue R(x), is recirculated in the stages 104 through 136. When all seventeen symbols of E1(x) have entered the circuit 28, all seventeen symbols of the residue R(x) will be present in the stages 104 through 136. If the two sets of checksum symbols are equal, then the resulting residue symbols after seventeen successive CLOCK pulses then residing in the shift register would all be zero. Any differences between the two sets of checksum symbols E1(x) and E2(x) is reflected in the stages 104 through 136. From this difference, error syndromes are computed by the syndrome computation logic 68 (FIG. 3) which receives the symbols of the residue R(x) when the controller 48 (FIG. 3) enables the output gates 194. Thus, the residue generator 28 serves both as a comparator for comparing the stored checksum symbols E1(x) and the newly generated checksum symbols E2(x), as well as a storage register for residue R(x) after the comparison is made.

As previously explained, an error detector 192 connects to the connection 140. It monitors the comparisons of E1(x) and E2(x) on a symbol-by-symbol basis so that the appropriate control signal can be generated immediately upon generation of the residue R(x). The symbols of the residue R(x) also appear in real time at the output gates 192.

Figure 9:
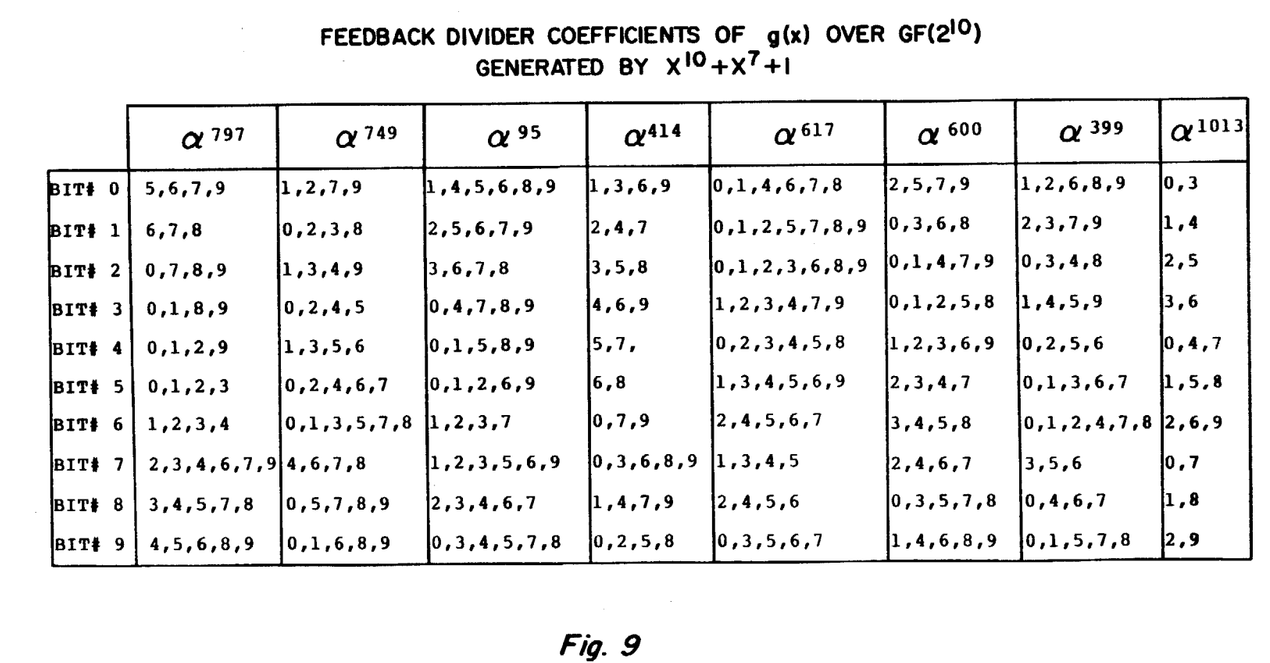
FIG. 9 is a table showing the feedback interconnections for all of the feedback multiplier circuits for the primitive polynomial $x^{10}+x^7+1$.

The encoder circuit 28 also can be constructed to encode data word d(x) to produce code words w(x) according to a generator polynomial g(x) having roots $\alpha^i$ in the Galois Field $GF(2^{10})$ generated by the primitive polynomial $x^{10}+x^7+1$. In this case, the encoder circuit 28 would be similarly constructed, except that the multiplier coefficients of the feedback circuit 101 would apply the bit numbers of the data word symbols on the feedback bus 141 to a multiplier circuit constructed according to the table shown in FIG. 9, instead of FIG. 8. The circuit operation would be the same.

The foregoing illustrates the preferred embodiment of our invention. Modifications and extensions thereof, not specifically illustrated, can be made from the teachings herein without departing from the scope of the invention. Accordingly, we intend not to be bound to exactly what is shown or described, but rather, that our invention be embraced by the language of the appended claims.

Therefore, what we claim as new and novel, and desire to be secured by a Letters Patents is as follows:

1. A circuit for detecting and correcting errors occurring in a Reed-Solomon code word w(x) constituted by a data word d(x) having k data symbols and a checksum word E(x) having n-k data symbols, the symbols of said checksum word E(x) being elements in the Galois Field $GF(2^m)$, for any integer m greater than 0, said checksum word being derived by encoding said data word d(x) by a predetermined generator polynomial g(x) having roots $\alpha^i$ wherein $\alpha$ is a primitive element in the Galois Field $GF(2^m)$, said circuit comprising:

A. receiving means for receiving a word y(x) that was transmitted as the code word w(x), said word y(x) being comprised of a data word c(x) having k symbols and a checksum word E1(x) having n−k symbols, B. Reed-Solomon encoding means for encoding said data word c(x) by said generator polynomial g(x) for producing another checksum word E2(x), said encoding means comprising successively connected shift register stages and feedback means that enable encoding of the data word c(x) by said generator polynomial g(x) during shifting of the symbols thereof through said shift register, C. residue generating means connected to said receiving means and to said encoding means for receiving E1(x) and E2(x) for producing a residue R(x) therefrom by modulo-two summing respective symbols thereof, D. monitoring means connected to said residue generating means for indicating whether errors have occurred in the received word y(x), E. logic processing means responsive to said monitoring means for computing error syndromes $S_i$ from said residue R(x) thereby to enable the computation of error location signals and error value signals corresponding to the respective locations and values of errors occurring in data word c(x), and F. correcting means responsive to said error location and error value signals for correcting errors occurring in data word c(x) located in said receiving means.

2. A circuit as recited in claim 1 wherein said predetermined generator polynomial g(x) is characterized by having roots $\alpha^i$ wherein $\alpha$ is a primitive element in $GF(2^{10})$ generated by the primitive polynomial $x^{10}+x^3+1$, and said Reed-Solomon encoding means comprises:
   i. means for encoding said received data word c(x) by said generator polynomial g(x) characterized as such thereby to produce the checksum word E2(x).

3. A circuit as recited in claim 1 wherein said predetermined generator polynomial g(x) is characterized by having roots $\alpha^i$ wherein $\alpha$ is a primitive element in $GF(2^{10})$ generated by the primitive polynomial $x^{10}+x^7+1$, and said Reed-Solomon encoding means comprises:
   i. means for encoding said received data word c(x) by said generator polynomial g(x) characterized as such thereby to produce the checksum word E2(x).

4. A circuit as recited in claim 1 for correcting T symbols of the received word y(x) that are in error wherein said predetermined generator polynomial g(x) is further characterized by having (2T+1) factors which are symmetrical about the factor $(x+\alpha^0)$, and said Reed-Solomon encoding means comprises:
   i. means for encoding said received data word c(x) by said generator polynomial characterized as such thereby rendering symmetrical the feedback divider coefficients of g(x) applied to the shift register stages of said Reed-Solomon encoding means.

5. A circuit as recited in claim 1, 2, 3, or 4 wherein said monitoring means comprises:
   i. means for producing a first control signal when the number of non-zero symbols in the residue R(x) is less than or equal to T thereby indicating that c(x) is correct,
   ii. means for producing a second control signal when the number of non-zero symbols in the residue R(x) is equal to (T+1) thereby indicating the c(x) is uncorrectable, and
   iii. means for producing a third control signal when the number of non-zero symbols in the residue R(x) is greater than or equal to (T+2) thereby indicating that c(x) is erroneous and possibly correctable.

6. A circuit as recited in claim 5 wherein said logic processor means further includes:
   i. single error testing means for testing whether $S_{i+1}/S_i$ is constant for all syndromes $S_i$ thereby to immediately determine whether a single error exists in the data word c(x), and
   ii. means responsive to said single error testing means and connected to said correcting means for generating a single error location signal and single error value signal thereby to enable said correcting means to immediately correct said single error without significant delay.

7. A circuit as recited in claim 6 wherein T equals eight and said generator polynomial g(x) is further characterized by:

$$\prod_{i=-8}^{+8} (x + \alpha^i)$$

thereby to provide for the correction of eight 10-bit symbols in y(x) which are in error and the capability of detecting whether nine or more 10-bit symbols in y(x) are in error.

8. In a digital data processing system including data storage means, a circuit for detecting and correcting errors occurring in digital data that is transferred between the data processing system and said data storage means, which circuit comprises:

A. Reed-Solomon encoding means for encoding a data word d(x) having k symbols upon transfer thereof from the data processing system to said data storage means thereby to produce an n-symbol code word w(x) constituted by said k-symbol data word d(x) and a checksum word E(x) having n−k symbols, said encoding means comprising plural successively connected shift register stages and feedback means that enable encoding of the data word d(x) by a generator polynomial g(x) during shifting of the data word through said shift register stages, B. means for storing said code word w(x) in said data storage means, C. retrieval means for retrieving from said data storage means a word y(x) that was previously stored as the code word w(x), said word y(x) being constituted by a data word c(x) having k symbols and a checksum word E1(x) having n−k symbols, said retrieval means including:
   i. receiving means connected to said data storage means for receiving the data word c(x) and the checksum word E1(x),
   ii. means connected to said Reed-Solomon encoding means and the data storage means for producing a second checksum word E2(x) having n−k symbols by encoding the data word c(x) with the same Reed-Solomon encoding means that produced the checksum word E1(x),
   iii. residue generating means that receives the symbols of the checksum words E1(x) and E2(x) for producing a residue R(x) therefrom by modulo-two summing respective symbols thereof, iv. monitoring means that receives said residue R(x) for indicating whether errors have occurred in the word y(x), v. logic processing means responsive to said monitoring means for computing error syndromes $S_i$ from said residue R(x) thereby to enable the computation of error location signals and error value signals corresponding to the respective locations and values of errors occurring in data word c(x), and vi. correcting means responsive to said error location and error value signals for correcting errors occurring in said data word c(x) which are located in said receiving means prior to being transferred to said data processing system.

9. A circuit as recited in claim 8 for detecting and correcting errors in digital data further including:

D. connection means for handling the transfer of data between said data processing system and said data storage means, said connection means comprising:

i. input enabling means for enabling the transfer of the data word d(x) from the data processing system or the data word c(x) from the data storage means to said encoding means, ii. feedback enabling means for enabling the encoding of the data word d(x) or c(x), iii. clocking means for successively shifting each symbol of the data word d(x) or c(x) into said encoding means, iv. first control means operative upon transfer of the data word d(x) from the data processing system to said encoding means for (a) energizing said input enabling means and said feedback enabling means to successively shift and encode the symbols of d(x) under control of said clocking means thereby to produce the checksum word E(x), (b) de-energizing said input enabling means and said feedback enabling means after k symbols of d(x) have been shifted and encoded by said encoding means, and (c) for enabling the symbols of said checksum word E(x) then present in said encoding means to be transferred to said data storage means under control of said clocking means, and v. second control means operative upon transfer of the data word c(x) from the data storage means to said encoding means for (a) energizing said input means and said feedback means to successively shift and encode the symbols of c(x) under control of said clocking means thereby to produce the checksum word E2(x), and (b) disabling said feedback means after the transfer of the data word c(x) thereto thereby to provide the continued shifting of the symbols of the checksum word E1(x) from said data storage means into the shift registers of said encoding means for producing said residue R(x) under control of said clocking means.

10. A circuit as recited in claim 8 or 9 wherein said Reed-Solomon encoding means comprises means for encoding said transmitted data words d(x) and said received data word c(x) by a generator polynomial g(x) whose factors are powers of a primitive element α in the Galois Field ($2^{10}$) generated by the primitive polynomial $x^{10}+x^3+1$ thereby to respectively produce the checksum words E1(x) and E2(x) from which said residue R(x) is produced.

11. A circuit as recited in claim 10 for correcting T symbols of the received code word y(x) wherein said generator polynomial g(x) is further characterized by having (2T+1) factors which are symmetrical about the factor $(X+\alpha^0)$ thereby rendering symmetrical the feedback divider coefficients of g(x) applied to the shift register stages of said Reed-Solomon encoding means.

12. A circuit as recited in claim 11 wherein said monitoring means comprises:

i. means for producing a first control signal when the number of non-zero symbols in the residue R(x) is less than or equal to T thereby indicating that c(x) is correct, ii. means for producing a second control signal when the number of non-zero symbols in the residue R(x) is equal to (T+1) thereby indicating the c(x) is uncorrectable, and iii. means for producing a third control signal when the number of non-zero symbols in the residue R(x) is greater than or equal to (T+2) thereby indicating that c(x) contains errors which may be correctable, and said logic processor means further includes:

i. first control means responsive to said first control signal for immediately transferring said data word c(x) to said data processing system, ii. second control means responsive to said second control signal for again retrieving said code word y(x), and iii. third control means responsive to said third control signal for computing syndromes $S_i$ thereby to enable computation of said error value and error location signals.

13. A circuit as recited in claim 12 wherein said logic processor means further includes:

i. single error testing means for testing whether $S_{i+1}/S_i$ is constant for all syndromes thereby to immediately indicate that the received code word y(x) contains only a single error, and ii. means responsive to said single error testing means and connected to said correcting means for generating a single error location signal and single error value signal thereby to enable said correcting means to immediately correct said single error.

14. A circuit as recited in claim 13 wherein T equals eight and said generator polynomial g(x) being further characterized by:

$$\prod_{i=-8}^{+8} (x + \alpha^i)$$

thereby to provide for the correction of eight 10-bit symbols of d(x) which are in error and the capability of detecting whether nine or more 10-bit symbols of y(x) are in error.

15. A circuit as recited in claim 8 or 9 wherein said Reed-Solomon encoding means comprises means for encoding said transmitted data words d(x) and said received data word c(x) by a generator polynomial g(x) whose factors are powers of a primitive element α in the Galois Field ($2^{10}$) generated by the primitive polynomial $x^{10}+x^7+1$ thereby to respectively produce the checksum words E1(x) and E2(x) from which said residue R(x) is produced.

16. A circuit as recited in claim 15 for correcting T symbols of the received word y(x) wherein said generator polynomial g(x) is further characterized by having (2T+1) factors which are symmetrical about the factor $(X+\alpha^0)$ thereby rendering symmetrical the feedback divider coefficients of g(x) applied to the shift register stages of said Reed-Solomon encoding means.

17. A circuit as recited in claim 16 wherein said monitoring means comprises:
  i. means for producing a first control signal when the number of non-zero symbols in the residue R(x) is less than or equal to T thereby indicating that c(x) is correct,
  ii. means for producing a second control signal when the number of non-zero symbols in the residue R(x) is equal to (T+1) thereby indicating the c(x) is uncorrectable, and
  iii. means for producing a third control signal when the number of non-zero symbols in the residue R(x) is greater than or equal to (T+2) thereby indicating that c(x) contains errors which may be correctable, and said logic processor means further includes:
  i. first control means responsive to said first control signal for immediately transferring said data word c(x) to said data processing system,
  ii. second control means responsive to said second control signal for again retrieving said code word y(x), and
  iii. third control means responsive to said third control signal for computing syndromes $S_i$ thereby to enable computation of said error value and error location signals.

18. A circuit as recited in claim 17 wherein said logic processor means further includes:
  i. single error testing means for testing whether $S_{i+1}/S_i$ is constant for all syndromes thereby to immediately indicate that the received code word y(x) contains only a single error, and
  ii. means responsive to said single error testing means and connected to said correcting means for generating a single error location signal and single error value signal thereby to enable said correcting means to immediately correct said single error.

19. A circuit as recited in claim 18 wherein T equals eight and said generator polynomial g(x) being further characterized by:

$$\prod_{i=-8}^{+8} (x + \alpha^i)$$

thereby to provide for the correction of eight 10-bit symbols of d(x) which are in error and the capability of detecting whether nine or more 10-bit symbols of y(x) are in error.

* * * * *